US010203377B2

(12) United States Patent
Fukuhara

(10) Patent No.: US 10,203,377 B2
(45) Date of Patent: Feb. 12, 2019

(54) DEVICE, METHOD, AND NON-TRANSITORY RECORDING MEDIUM STORING PROGRAM FOR SPECIFYING ABNORMALITY-OCCURRENCE AREA OF SECONDARY BATTERY SYSTEM

(71) Applicant: NGK INSULATORS, LTD., Nagoya (JP)

(72) Inventor: Motohiro Fukuhara, Nagoya (JP)

(73) Assignee: NGK Insultors, Ltd., Nagoya (JP)

( * ) Notice: Subject to any disclaimer, the term of this patent is extended or adjusted under 35 U.S.C. 154(b) by 385 days.

(21) Appl. No.: 15/053,257

(22) Filed: Feb. 25, 2016

(65) Prior Publication Data
US 2016/0169978 A1  Jun. 16, 2016

Related U.S. Application Data

(63) Continuation of application No. PCT/JP2014/071601, filed on Aug. 19, 2014.

(30) Foreign Application Priority Data

Aug. 30, 2013  (JP) .................................. 2013-180563

(51) Int. Cl.
G01R 1/00 (2006.01)
G01R 31/36 (2006.01)
(Continued)

(52) U.S. Cl.
CPC ... G01R 31/3658 (2013.01); G01R 19/16542 (2013.01); G01R 31/3648 (2013.01);
(Continued)

(58) Field of Classification Search
CPC ........ G01R 1/00; G07C 1/00; G07C 2205/00; H02J 1/00; H02M 1/00; G05B 1/00; G05B 2219/00
See application file for complete search history.

(56) References Cited

U.S. PATENT DOCUMENTS 6,072,300 A    6/2000 Tsuji
9,755,430 B2 *  9/2017 Paquin ...................... H02J 1/00
(Continued)

FOREIGN PATENT DOCUMENTS

EP    2 085 784 A2    8/2009
EP    2 120 310 A1    11/2009
(Continued)

OTHER PUBLICATIONS

International Search Report and Written Opinion (Application No. PCT/JP2014/071601) dated Nov. 25, 2014.
(Continued)

Primary Examiner — Jermele M Hollington
Assistant Examiner — Temilade Rhodes-Vivour
(74) Attorney, Agent, or Firm — Burr & Brown, PLLC

(57) ABSTRACT

An apparatus for specifying an abnormality-occurrence area of a secondary battery system includes an information transmission unit for outputting block voltage values and an average block voltage value, an information acquisition unit for acquiring information about a module accommodating a block that has output a block voltage value when the difference between a reference block voltage value obtained from the correlation between the block voltage value and the average block voltage value and the block voltage value is equal to or greater than a preset voltage threshold, a notification reception unit for receiving a notification about the occurrence of an abnormality in a secondary battery, and a module specification unit for specifying at least the module corresponding to the latest module information as the module in which an abnormality occurred when the notification reception unit receives a notification.

13 Claims, 11 Drawing Sheets

(51) Int. Cl.
*H02J 7/00* (2006.01)
*G01R 19/165* (2006.01)

(52) U.S. Cl.
CPC ............ *G01R 31/3679* (2013.01); *H02J 7/00* (2013.01); *G01R 1/00* (2013.01); *G05B 2219/00* (2013.01); *G07C 2205/00* (2013.01)

(56) References Cited

U.S. PATENT DOCUMENTS

| | | | |
|---|---|---|---|
| 2004/0155661 A1* | 8/2004 | Field | B60L 3/12 |
| | | | 324/426 |
| 2009/0130538 A1 | 5/2009 | Kaita et al. | |
| 2010/0244847 A1* | 9/2010 | Kudo | B60L 3/0046 |
| | | | 324/433 |
| 2011/0006603 A1* | 1/2011 | Robinson | G06F 1/263 |
| | | | 307/31 |
| 2014/0306533 A1* | 10/2014 | Paquin | H02J 3/383 |
| | | | 307/52 |

FOREIGN PATENT DOCUMENTS

| | | |
|---|---|---|
| EP | 2 428 809 A2 | 3/2012 |
| JP | 03-158781 A1 | 7/1991 |
| JP | H09-015311 A | 1/1997 |
| JP | 2000-123883 A | 4/2000 |
| JP | 2011-075314 A | 4/2011 |

OTHER PUBLICATIONS

Extended European Search Report, European Application No. 14839918.1, dated May 19, 2017 (13 pages).

* cited by examiner

FIG. 9
96

| DATE (YEAR, MONTH, DAY) | TIME (HOUR, MINUTE) | MODULE STRING INFORMATION | MODULE INFORMATION | BLOCK INFORMATION | PRESENT BLOCK VOLTAGE VALUE |

DEVICE, METHOD, AND NON-TRANSITORY RECORDING MEDIUM STORING PROGRAM FOR SPECIFYING ABNORMALITY-OCCURRENCE AREA OF SECONDARY BATTERY SYSTEM

CROSS-REFERENCE TO RELATED APPLICATIONS

This application is a Continuation of International Application No. PCT/JP2014/071601 filed on Aug. 19, 2014, which is based upon and claims the benefit of priority from Japanese Patent Application No 2013-180563 filed on Aug. 30, 2013, the contents all of which are incorporated herein by reference.

TECHNICAL FIELD

The present invention relates to an apparatus (device), a method, and a non-transitory recording medium storing a program for identifying (specifying) a position of an abnormality (abnormality-occurrence area) occurred in a secondary battery system including two or more modules each accommodating one or more blocks. Each of the blocks is formed by connecting battery cells of two or more secondary batteries.

BACKGROUND ART

In general, frequency adjustment in an electric power system and adjustment of power demands and power supplies in the electric power system are carried out using a plurality of power generators, storage batteries, etc., equipped in the electric power system. Further, in most cases, adjustment in the difference between the generated electric power from natural energy based power generators and its planned output electric power, and reduction in the changes of electric power generated by the natural energy based power generators are also performed using the power generators, storage batteries, etc. In comparison with general electric power generators, the storage batteries can change the electric power output at high speed, and can be used effectively in frequency adjustment of the electric power system, adjustment of the difference between the generated electric power from natural energy based power generators and its planned output electric power, and adjustment of power demands and power supplies in the electric power system.

In this regard, as a storage battery operated at high temperature connected to the electric power system, a sodium-sulfur battery (hereinafter referred to as the NaS battery) is used, for example. This NaS battery is a high temperature secondary battery containing metal sodium and sulfur as active materials in an isolated manner using a solid electrolyte tube. When the NaS battery is heated at about 300° C., a certain amount of energy is produced by an electrochemical reaction of both of the melted active materials. Normally, the NaS battery is formed by assembling a plurality of battery cells, and used in a form of a module including a plurality of battery cells connected together. That is, the module has structure where circuits (strings) each formed by connecting a plurality of battery cells in series are connected in parallel to form a block, and at least two blocks are connected in series, and placed in a heat insulating container.

As a method of reporting occurrence of an abnormality of such a module, a method of detecting an abnormality of a battery by comparing electric discharge depth of each block, and notifying the abnormality is disclosed (e.g., see Japanese Laid-Open Patent Publication No. 03-158781). In this method, the presence of the abnormality is determined for each of the blocks of the module. Therefore, in comparison with the case of detecting the abnormality for each of the individual NaS battery cells of the block, the apparatus is not complicated, and the production cost can be reduced advantageously.

SUMMARY OF INVENTION

It is considered that failures in the battery cells, and consequently, failures in the modules are caused by internal short circuiting or external short circuiting in the battery cells.

For example, external short circuiting of the battery cells may be caused by formation of an external short circuiting loop due to leakage of active materials in the battery cells. For example, internal short circuiting of the battery cells may be caused by damages, etc. of a beta tube.

External short circuiting and internal short circuiting of these battery cells can be detected by checking the electric discharge depth in each block as can be seen from Japanese Laid-Open Patent Publication No. 03-158781. However, the change in the electric discharge depth due to short circuiting does not occur rapidly, but occur gradually over a relatively long period of time. Therefore, it is difficult to determine which module (or which block) has the abnormality, and initial response to the occurrence of the abnormality may be delayed undesirably.

The present invention has been made to take the problems of this type into account, and an object of the present invention is to provide an apparatus, a method, and a non-transitory recording medium storing a program for identifying a position of an abnormality occurred in a secondary battery system in which if an abnormality occurs, it is possible to identify a module as the abnormality source at an early stage, and it is possible to implement an initial response to the occurrence of the abnormality at an early stage.

[1] An apparatus according to the first invention is an apparatus for identifying a position of an abnormality occurred in a secondary battery system. The secondary battery system includes a plurality of modules each accommodating one or more blocks. Each of the blocks is formed by connecting battery cells of two or more secondary batteries. The apparatus includes a voltage measurement unit configured to detect voltage of the secondary batteries on a block by block basis, and to output the detected voltage as a block voltage value every unit time, an average block voltage calculation unit configured to calculate an average block voltage value of each module, based on the block voltage value provided from the voltage measurement unit every unit time, an information acquisition unit configured to acquire information of a module (module information) accommodating a block as an output source of the block voltage value, when a reference block voltage value is obtained from correlation relationship between the block voltage value and an average block voltage value of the corresponding module, and a difference between the reference block voltage value and the block voltage value is a predetermined voltage threshold value or more, a report reception unit configured to receive a report of an abnormality occurred in the secondary batteries, and a module identification unit configured to identify, as a module having the abnormality, the module corresponding to the module information at time of receiving the report by the report reception unit.

If external short circuiting or internal circuiting occurs in any one of the battery cells, the block voltage value of the block including the battery cell having the short circuiting is decreased steeply. Thereafter, in some cases, after the elapse of a certain time period, the voltage returns to the original voltage level before short circuiting. Further, if the scale of the system becomes large, the number of blocks to be monitored is increased correspondingly. Therefore, it becomes further difficult to recognize the decrease in the voltage due to short circuiting from the changes of the block voltage values of all of the blocks. However, in the present invention, the reference block voltage is obtained from correlation relationship between the block voltage value and the average block voltage value. When the difference between the reference block voltage and the block voltage value is the predetermined voltage threshold value or more, information of the module which accommodates the block as the output source of the block voltage value is acquired. In this manner, it is possible to accurately detect whether there is a decrease in the block voltage, and detect occurrence of an abnormality due to short circuiting.

Therefore, in the present invention, by identifying the module which is the source of the abnormality, it becomes possible to send a report to a local user, a local administrator, etc. Thus, countermeasures focused on the identified abnormality source can be taken at an early stage. It becomes possible to suppress expansion of damage.

[2] In the first invention, the information acquisition unit may include a voltage comparator unit configured to compare the difference between the block voltage value and the reference block voltage value with a predetermined voltage threshold value, and the voltage comparator unit may include a linear regression processing unit configured to perform linear regression processing of relationship between a plurality of block voltage values and a plurality of average block voltage values accumulated in a fixed period to obtain information of one regression line, and a reference voltage acquisition unit configured to acquire the reference block voltage value corresponding to the block voltage value every unit time, based on information of the regression line. In this manner, it is possible to obtain the reference block voltage value easily based on the correlation relationship between the block voltage value and the average block voltage value, and achieve acceleration of computation.

[3] In the case [2], the linear regression processing unit may accumulate the plurality of block voltage values and the plurality of average block values, and concurrently, perform linear regression processing of relationship between the plurality of block voltage values and the plurality of average block voltage values accumulated in the fixed period in last time to obtain information of one regression line.

[4] In this case, the regression line may be updated at every interval of the fixed period, and the reference voltage acquisition unit may acquire the reference block voltage value of the fixed period in present time, based on the information of the regression line acquired in the fixed period in the last time.

[5] In the case [2], the linear regression processing unit may accumulate the plurality of block voltage values and the plurality of average block values in the fixed period, and in a period corresponding to the unit time at an end of the fixed period, may perform linear regression processing of relationship between the plurality of block voltage values and the plurality of average block voltage values accumulated in the fixed period to acquire information of one regression line.

[6] In this case, the regression line may be updated at every interval of the fixed period, and the reference voltage acquisition unit may acquire the reference block voltage value in the fixed period in present time based on information of the regression line acquired in a period corresponding to the unit time at the end of the fixed period in last time.

[7] In any of the cases [2] to [6], in a period from time of starting operation of the secondary battery system to time at which information of the regression line is acquired for first time, since information of the regression line is not acquired, no operation may be performed at least in the reference voltage acquisition unit and the information acquisition unit.

[8] In any of cases [2] to [7], the block voltage value may be inputted to the linear regression processing unit and the reference voltage acquisition unit through a delay circuit for introducing a delay by the fixed period, and the average block voltage value may be inputted to the linear regression processing unit through a delay circuit configured to introduce a delay by the fixed period. In this manner, it becomes possible to determine the fixed period arbitrarily depending on the system scale, etc., to achieve excellent versatility.

[9] In this case, delay time in the delay circuits may be selected in accordance with behavior where the block voltage drops temporarily due to short circuiting of at least one of the battery cells. In this manner, it is possible to improve the detection accuracy of the block having a temporary drop in the block voltage due to short circuiting of at least one of the battery cells.

[10] In the first invention, as the voltage threshold value, a voltage value of a temporary drop in the block voltage due to short circuiting of at least one of the battery cells may be selected. In this manner, it is possible to improve the detection accuracy of the block having a temporary drop in the block voltage due to short circuiting of at least one of the battery cells.

[11] In the first invention, the apparatus may further include an error output unit configured to receive the module information from the information acquisition unit, and to output the module information together with an error message. By outputting the module information together with the error message to a monitor or a printer, the position of the identified module can be recognized at a glance advantageously.

[12] A method according to the second invention is a method of identifying a position of an abnormality occurred in a secondary battery system. The secondary battery system includes a plurality of modules each accommodating one or more blocks. Each of the blocks is formed by connecting battery cells of two or more secondary batteries. The method includes the steps of performing voltage measurement by detecting voltage of the secondary batteries on a block by block basis, and outputting the detected voltage as a block voltage value every unit time, performing average block voltage calculation by calculating an average block voltage value of each module, based on the block voltage value provided from the voltage measurement step every unit time, performing information acquisition by acquiring information of a module (module information) accommodating a block as an output source of the block voltage value, when a reference block voltage value is obtained from correlation relationship between the block voltage value and an average block voltage value of the corresponding module, and a difference between the reference block voltage value and the block voltage value is a predetermined voltage threshold value or more, performing report reception by receiving a report of an abnormality occurred in the secondary batteries, and performing module identification by identifying, as a module having the abnormality, the module corresponding to the module information at time of receiving the report by the report reception step.

[13] A non-transitory recording medium according to the third invention stores a program for a secondary battery system. The second battery system includes a plurality of modules each accommodating one or more blocks. Each of the blocks is formed by connecting battery cells of two or more secondary batteries. Further, the secondary battery system includes a voltage measurement unit configured to detect voltage of the secondary batteries on a block by block basis, and to output the detected voltage as a block voltage value every unit time, and an average block voltage calculation unit configured to calculate an average block voltage value of each module, based on the block voltage value provided from the voltage measurement unit every unit time. The program is configured to allow the secondary battery system to perform functions of acquiring information of a module (module information) accommodating a block as an output source of the block voltage value, when a reference block voltage value is obtained from correlation relationship between the block voltage value and an average block voltage value of the corresponding module, and a difference between the reference block voltage value and the block voltage value is a predetermined voltage threshold value or more, receiving a report of an abnormality occurred in the secondary batteries, and identifying, as a module having the abnormality, the module corresponding to the module information at time of receiving the report by the report reception function.

As described above, in the apparatus, the method, and the non-transitory recording medium storing the program for identifying a position where an abnormality occurs in a secondary battery system, it is possible to identify a module (or a block) as the abnormality source at an early stage, and it is possible to implement an initial response to the occurrence of the abnormality at an early stage.

BRIEF DESCRIPTION OF DRAWINGS

FIG. 9 is a diagram showing an example of a format of alarm information data.

DESCRIPTION OF EMBODIMENTS

Hereinafter, an apparatus, a method, and a non-transitory recording medium storing a program for identifying a position of an abnormality occurred in a secondary battery system according to an embodiment of the present invention will be described with reference to FIGS. 1 to 11.

Figure 1:
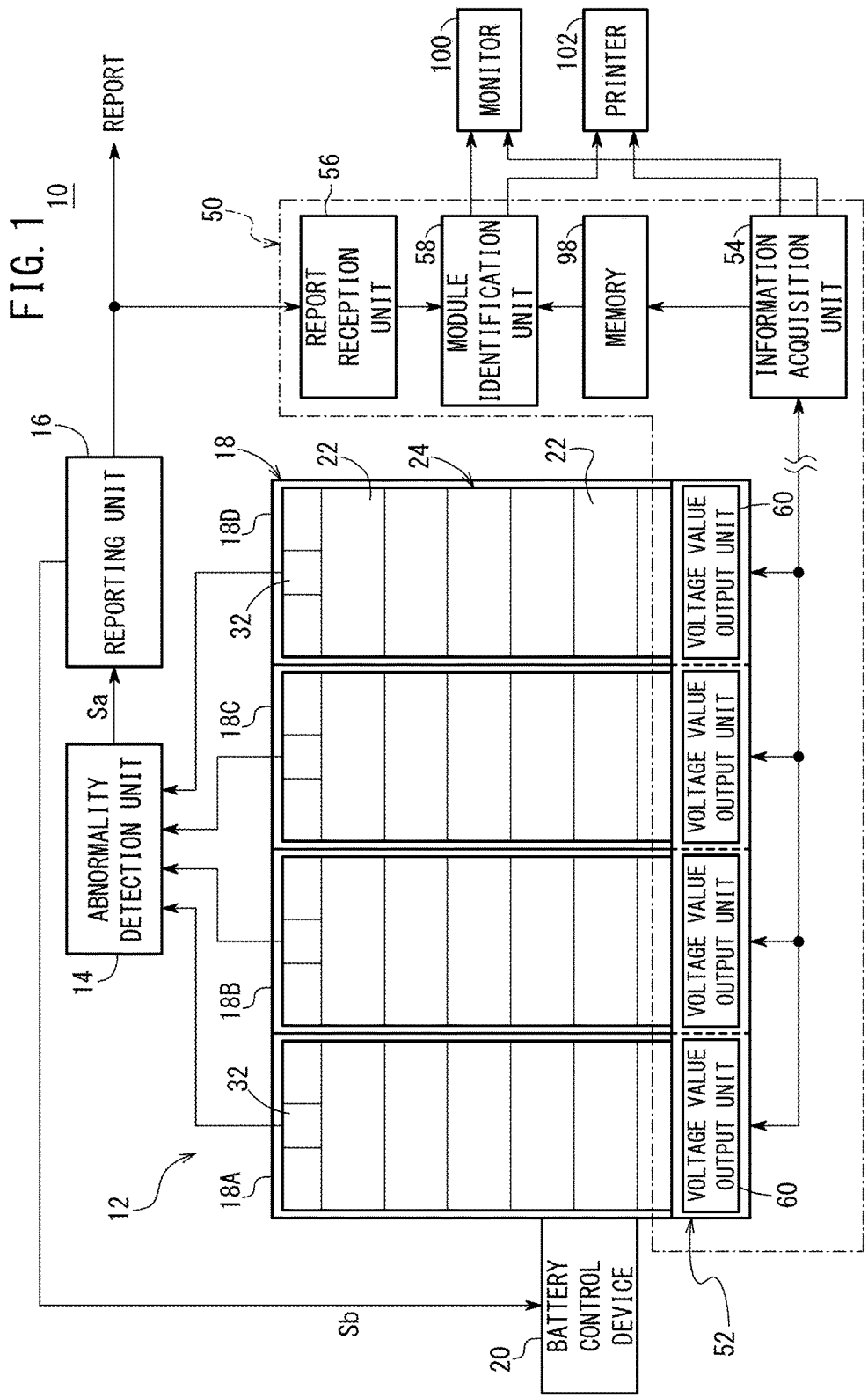
FIG. 1 is a diagram showing structure of a secondary battery system and an apparatus for identifying a position of an abnormality occurred in the secondary battery system according to an embodiment of the present invention.

Firstly, as shown in FIG. 1, a secondary battery system 10 to which the apparatus, the method, and the non-transitory recording medium storing the program according to the embodiment of the present invention is applied includes a secondary battery storage unit 12, an abnormality detection unit 14, and a reporting unit 16.

The secondary battery storage unit 12 has structure where a plurality of box shaped packages 18 are arranged in a lateral direction. In an example of FIG. 1, four packages 18 (first package 18A to fourth package 18D) are arranged in the lateral direction. Further, the secondary battery storage unit 12 has a battery control device 20 for controlling operation of the secondary batteries.

Two or more modules 22 are stacked in a vertical direction inside each of the packages 18. Further, each of the packages 18 accommodates a module string 24 formed by connecting these two or more modules 22 in series. In the structure of the example shown in FIG. 1, five modules 22 are stacked to form one module string 24.

Figure 2:
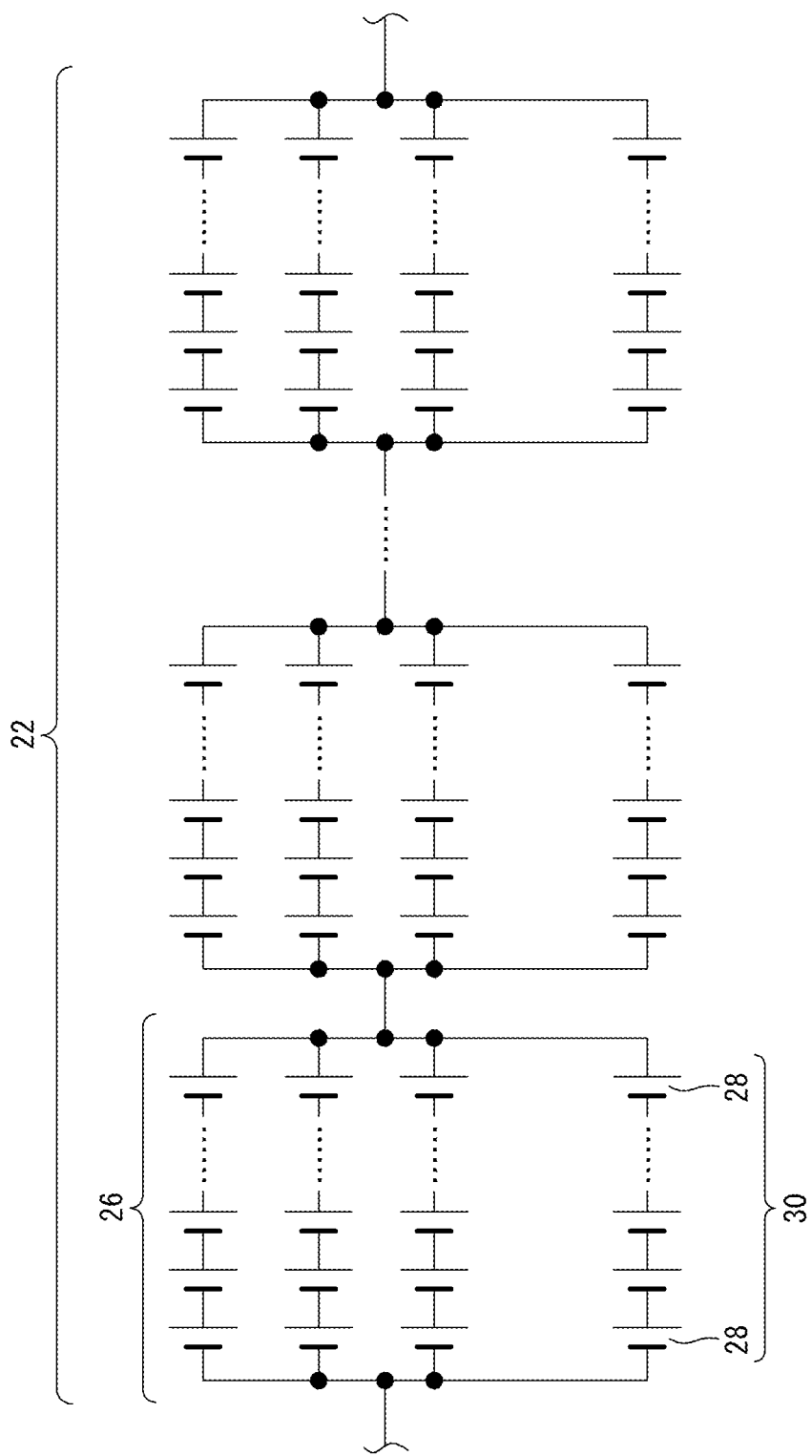
FIG. 2 is an equivalent circuit diagram showing a battery structural body included in a module.

As shown in FIG. 2, the module 22 is formed by connecting two or more blocks 26 in series. Each of the blocks 26 is formed by connecting two or more circuits (strings 30) in parallel, and each of the strings 30 is formed by connecting two or more battery cells 28 as the secondary batteries in series. For example, eight battery cells 28 are connected in series to form one string 30, 12 strings 30 are connected in parallel to form one block 26, and four blocks 26 are connected in series to form one module 22. As the secondary battery, a NaS battery, a lithium ion battery, a sodium ion battery, etc. may be used.

The abnormality detection unit 14 detects abnormal conditions such as a fire based on signals from sensors 32 (heat sensor, smoke sensor, etc.) provided in each of the packages 18.

The reporting unit 16 issues a report (abnormality report) indicating occurrence of an abnormality, and transmits the report to a monitoring center, etc., based on an input of an abnormality detection signal Sa (signal indicating occurrence of an abnormality) from the abnormality detection unit 14. In this case, the report may be transmitted through a public communications network such as the Internet or a mobile phone network. Further, the report may be transmitted to a local user, a local administrator, etc. instead of and/or in addition to the monitoring center.

Further, the reporting unit 16 outputs an operation stop signal Sb to the battery control device 20 in addition to the above report, based on the input of the abnormality detection signal Sa from the abnormality detection unit 14. The battery control device 20 stops operation of the secondary batteries in accordance with a predetermined sequence for stopping operation, based on the operation stop signal Sb.

Further, as shown in FIG. 1, an apparatus for identifying a position of an abnormality according to an embodiment of the present invention (hereinafter referred to as an abnormality position identification apparatus 50) includes an information transmission unit 52, an information acquisition unit 54, a report reception unit 56, and a module identification unit 58.

Figure 3:
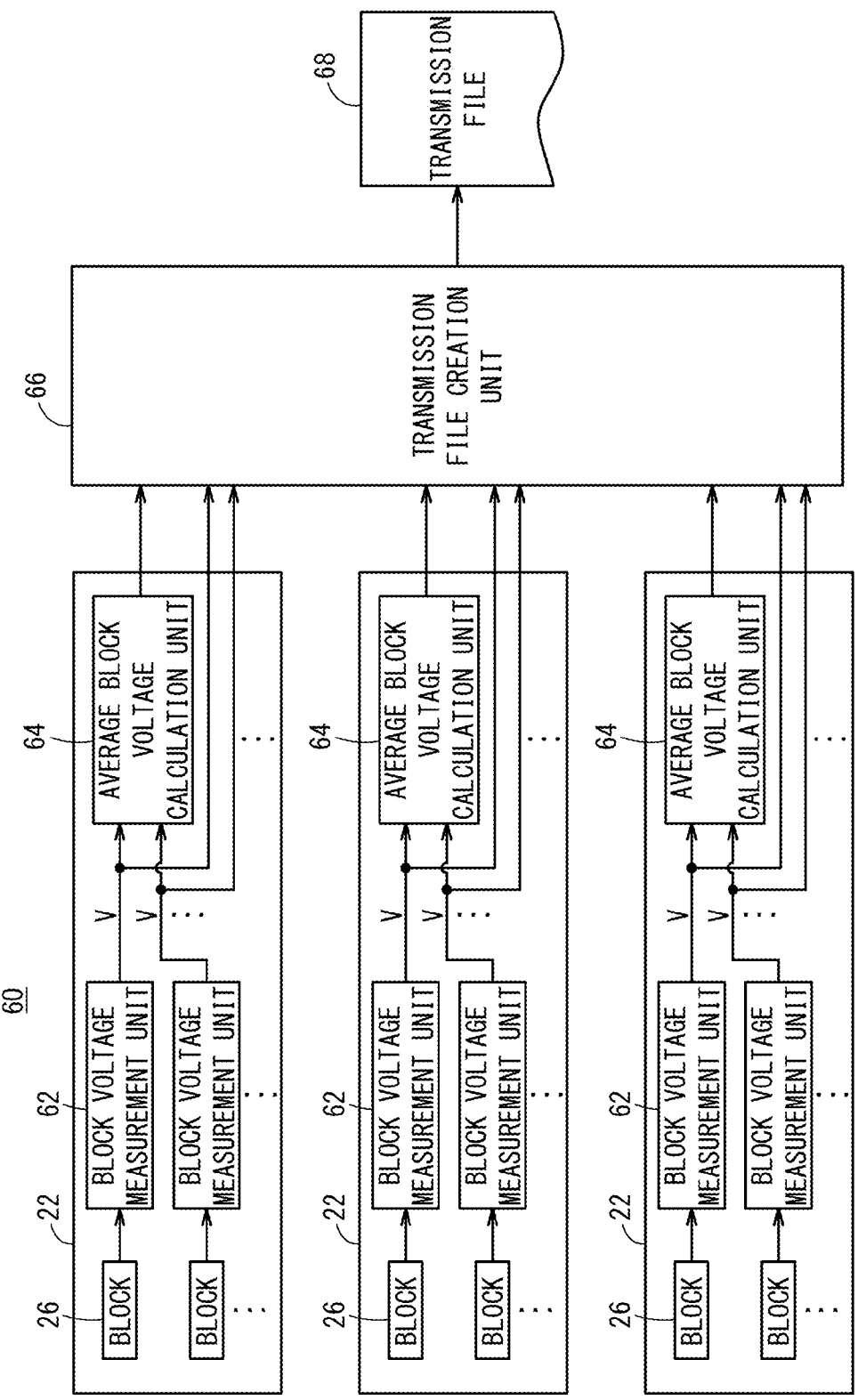
FIG. 3 is a block diagram showing structure of a voltage value output unit.

The information transmission unit 52 has a plurality of voltage value output units 60 provided for the respective module strings 24. As shown in FIG. 3, each of the voltage value output units 60 includes a plurality of block voltage measurement units 62 provided for the respective blocks, a plurality of average block voltage calculation units 64 provided for the respective modules 22, and one transmission file creation unit 66.

Each of the block voltage measurement units 62 measures the voltage across both ends of the corresponding block 26 in accordance with a predetermining monitoring cycle. For example, the block voltage measurement unit 62 measures the voltage across both ends of the corresponding block 26 at a time interval arbitrarily selected in a range from 0.5 to 2 seconds (e.g., one second interval: monitoring cycle).

The average block voltage calculation unit 64 calculates the average block voltage value Va of the corresponding module 22 based on the block voltage value V from the block voltage measurement unit 62 at each monitoring cycle.

Each of the transmission file creation units 66 creates a transmission file 68 including information of the corresponding module string 24 at each monitoring cycle. For example, the information of the module string 24 includes an identification number of the module string 24 (module string information), information of a plurality of modules 22 included in the module string 24, etc. For example, the information of the module 22 includes an identification number of the module 22 (module information), the average block voltage value Va of the module 22, identification numbers of a plurality of blocks 26 included in the module 22 (block information), and the present block voltage value V corresponding to the plurality of blocks 26, respectively.

Figure 4:
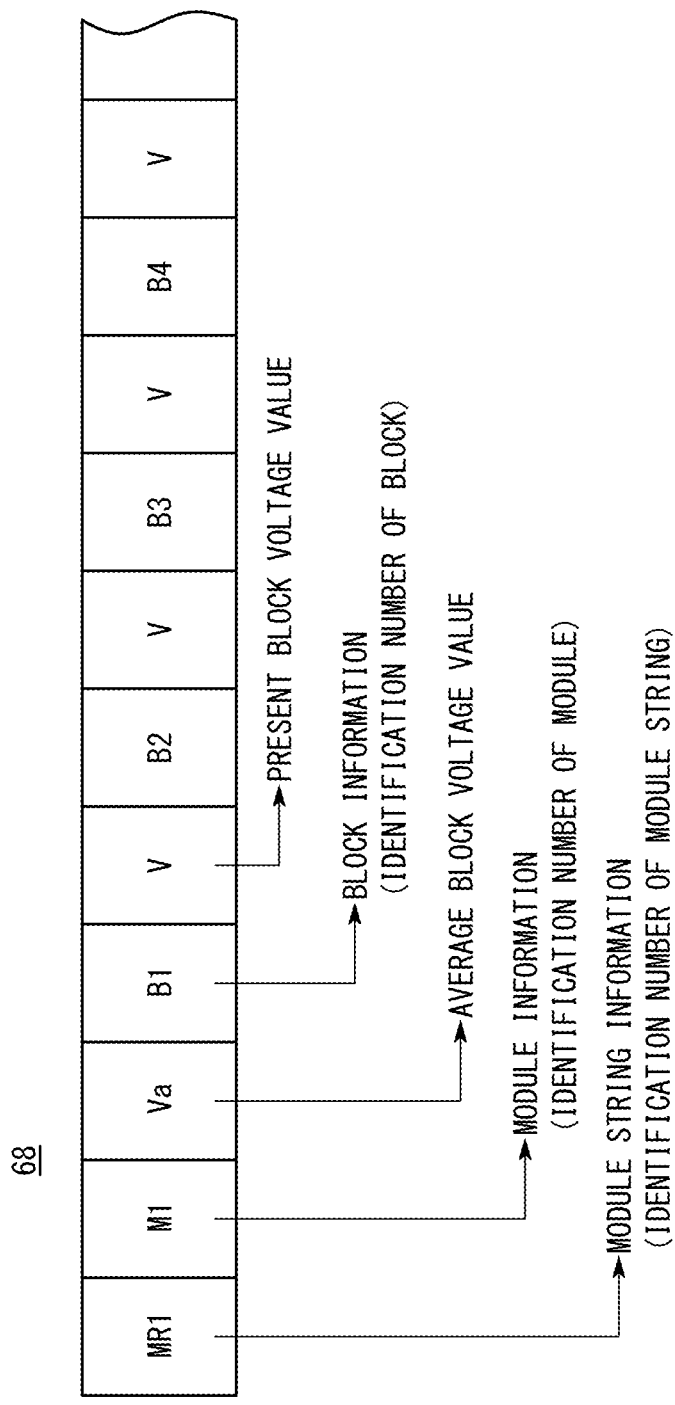
FIG. 4 is a diagram showing an example of a format of a transmission file.

As an example of a format of a transmission file 68, a format of the transmission file 68 associated with the first module string 24 is shown in FIG. 4. Specifically, in the order from the beginning, the format of the transmission file 68 includes an identification number (MR1) of the first module string 24, and information of a plurality of modules 22 included in the first module string 24.

As an example of the information of the module 22, the format of information of the first module 22 includes an identification number (M1) of the first module 22, an average block voltage value Va of this module 22, and information of a plurality of blocks 26 included in this module 22.

For example, the information of the plurality of blocks 26 includes the following items of information:

(1a) Identification number (B1) of the first block 26
(1b) Present block voltage value V of the first block 26
(1c) Identification number (B2) of the second block 26
(1d) Present block voltage value V of the second block 26
(1e) Identification number (B3) of the third block 26
(1f) Present block voltage value V of the third block 26
(1g) Identification number (B4) of the fourth block 26
(1h) Present block voltage value V of the fourth block 26

In the meanwhile, when the reference block voltage value Vb is obtained from the correlation relationship between the block voltage value V and the average block voltage value Va, and the difference between the reference block voltage value Vb and the block voltage value V exceeds a predetermined voltage threshold value Vth or more, the information acquisition unit 54 acquires information of a module 22 accommodating a block 26 as an output source of the block voltage value V.

Figure 5:
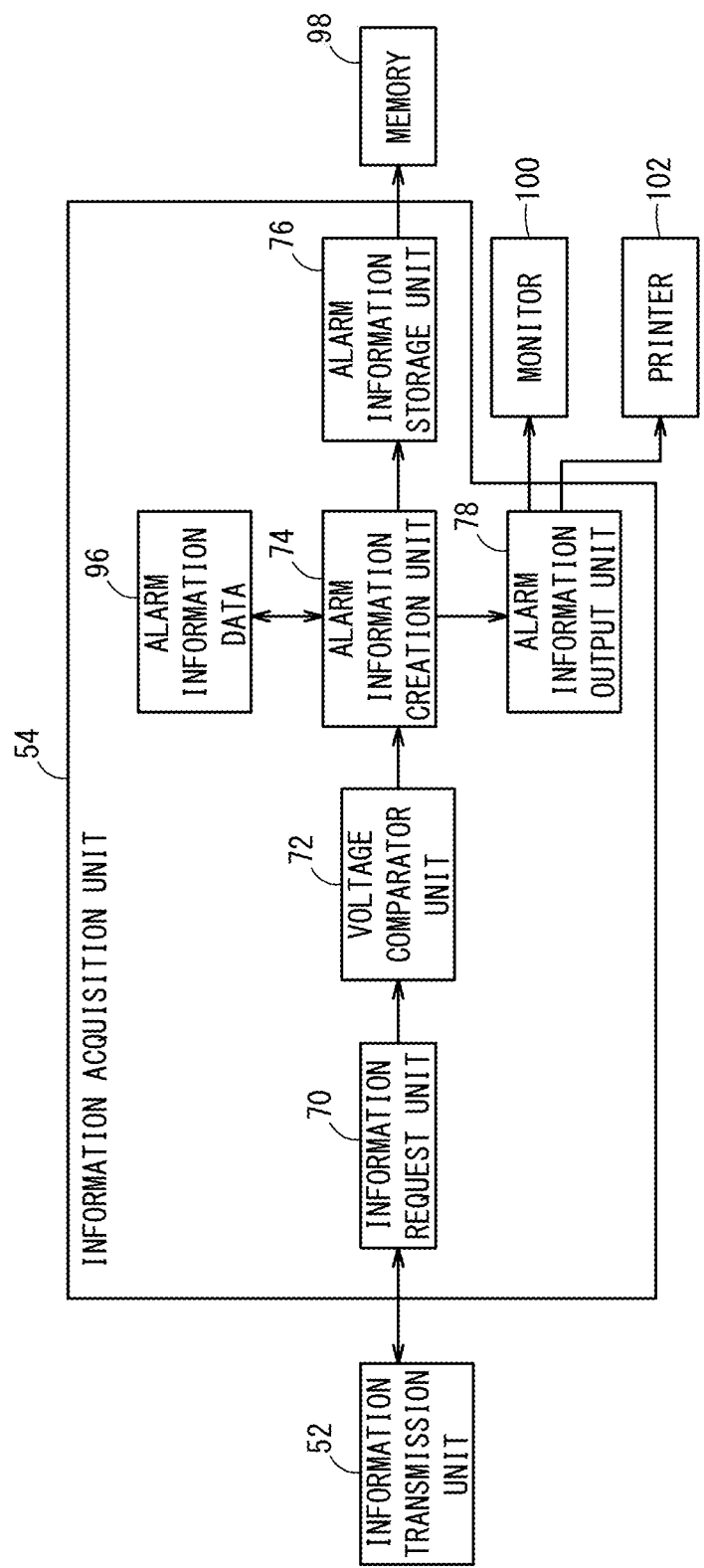
FIG. 5 is a block diagram showing structure of an information acquisition unit and an information transmission unit.

Specifically, as shown in FIG. 5, the information acquisition unit 54 includes an information request unit 70, a voltage comparator unit 72, an alarm information creation unit 74, an alarm information storage unit 76, and an alarm information output unit 78.

The information request unit 70 requests each of the voltage output units 60 of the information transmission unit 52 to transmit information at each monitoring cycle. Upon the transmission request of information from the information request unit 70, each of the voltage output units 60 transmits the transmission file 68 including information of the corresponding module string 24, to the information request unit 70.

Figure 6:
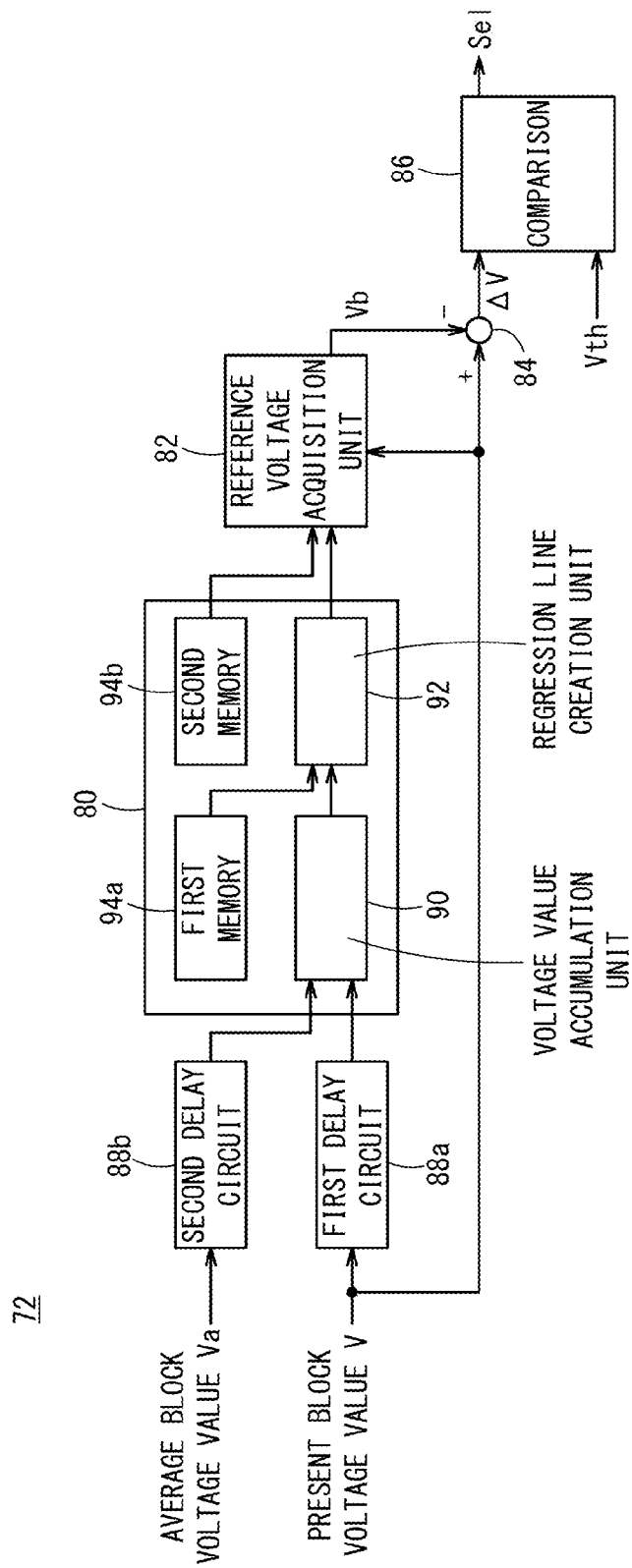
FIG. 6 is a block diagram showing structure of a voltage comparator circuit.

The voltage comparator unit 72 will be described taking one block 26 as an example. As shown in FIG. 6, a linear regression processing unit 80, a reference voltage acquisition unit 82, a subtracter 84, and a voltage comparator circuit 86.

The linear regression processing unit 80 performs linear regression processing of relationship between a plurality of block voltage values V accumulated in a fixed period and a plurality of average block voltage values Va to acquire information of one regression line. The reference voltage acquisition unit 82 acquires a reference block voltage value Vb corresponding to the block voltage value V based on the information of regression line every unit time. The subtracter 84 calculates the difference (differential voltage value ΔV) between the block voltage value V and the reference block voltage value Vb. The voltage comparator circuit 86 compares the differential voltage value ΔV from the subtracter 84 with a predetermined voltage threshold value Vth.

The block voltage value V is inputted to each of the linear regression processing unit 80, the reference voltage acquisition unit 82, and the subtracter 84 through a first delay circuit 88a, respectively. The average block voltage value Va is inputted to the linear regression processing unit 80 through a second delay circuit 88b.

The linear regression processing unit 80 includes a voltage value accumulation unit 90 and a regression line creation unit 92. The voltage value accumulation unit 90 accumulates a plurality of block voltage values V and a plurality of average block voltage values Va inputted every unit time, over a fixed period, in a first memory 94a. The regression line creation unit 92 creates a correlation diagram (dispersion diagram) of the plurality of block voltage values V and the plurality of average block voltage values Va accumulated in the first memory 94a, performs least squares regression processing of a regression line (map information) matching this regression diagram, and stores the resulting data in a second memory 94b.

Figure 7A:
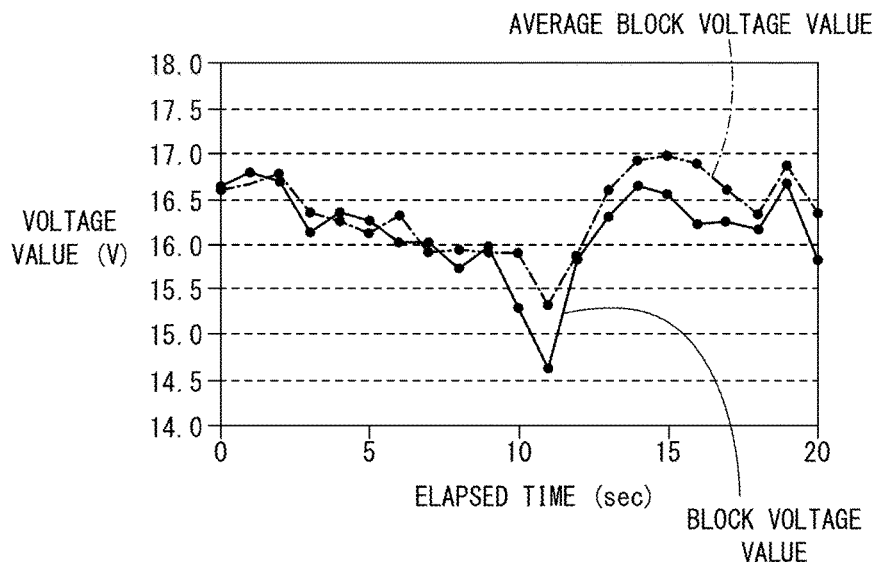
FIG. 7A is a graph showing an example of changes in the block voltage value and the average block voltage value in a fixed period.
Figure 7B:
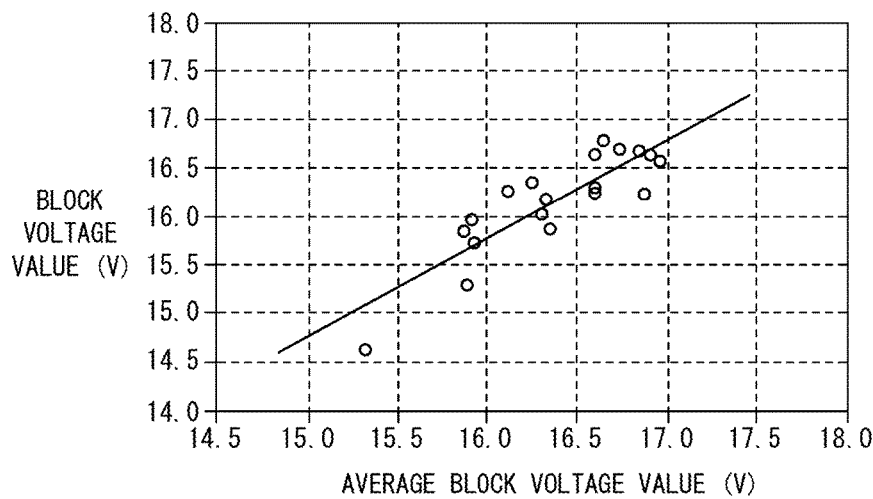
FIG. 7B is a graph showing a correlation diagram between the average block voltage value and the block voltage value, and a regression line matching the correlation diagram.

For example, as shown in FIG. 7A, it is assumed that the monitoring cycle is one second and that the fixed period is 20 seconds. The voltage value accumulation unit 90 obtains the block voltage value V and the average lock voltage value Va every second, and accumulates 20 block voltage values V and 20 average block voltage values Va in the first memory 94a in the fixed period. Then, as shown in FIG. 7B, the voltage value accumulation unit 90 creates a correlation diagram of the average block voltage values Va and the block voltage values V stored in the first memory 94a, determines a regression line La (map information) matching this correlation diagram by performing at least square regression processing, and stores the regression line La in the second memory 94b.

In the case where almost no changes are present in the block voltage value V over a fixed period or more, in order to avoid instability in the estimation formula used in least squares regression processing, a regression line (map information) which forcibly use 1 as a correlation coefficient is created.

The average block voltage value Va on the regression line La corresponding to the block voltage value V is the reference block voltage value Vb corresponding to this block voltage value V. Therefore, the reference voltage acquisition unit 82 acquires the reference block voltage value Vb corresponding to the block voltage value V, based on the map information of the regression line La at each monitoring cycle.

If the output (differential voltage value ΔV) from the subtracter 84 is the predetermined voltage threshold value Vth or more, the voltage comparator circuit 86 outputs an event log signal Sel to the alarm information creation unit 74.

For example, the following two types of processing sequence may be used in the above described linear regression processing unit 80.

Figure 8A:
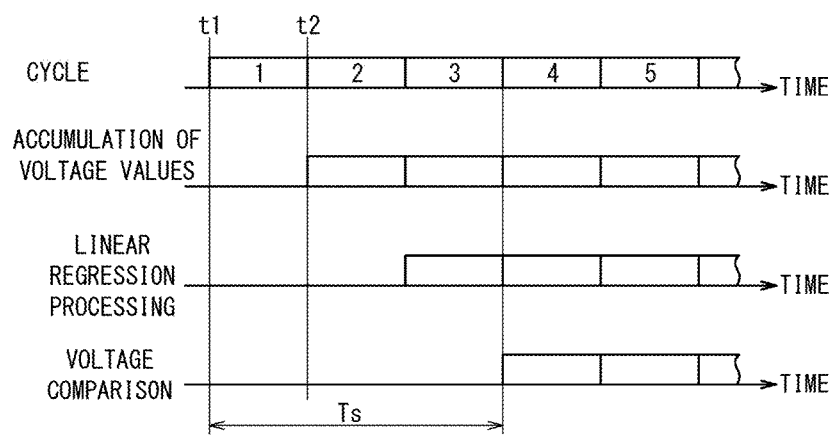
FIG. 8A is a timing chart showing a first processing sequence in a linear regression processing unit.

In the first processing sequence, as shown in FIG. 8A, in a fixed period (cycle 1) from the time t1 of starting operation of the secondary battery system 10, the block voltage value V and the average block voltage value Va are not inputted to the linear regression processing unit 80 due to the delays in the first delay circuit 88a and the second delay circuit 88b.

The block voltage value V and the average block voltage value Va are inputted to the linear regression processing unit 80 from the start point t2 of the next fixed period (cycle 2). The block voltage value V and the average block voltage value Va are inputted over this fixed period at each monitoring cycle, and accumulated in the first memory 94a.

In the next fixed period (cycle 3), the block voltage value V and the average block voltage value Va are inputted at each monitoring cycle, and while the block voltage value V and the average block voltage value Va are accumulated in the first memory 94a, the following processes are performed concurrently. Specifically, in the regression line creation unit 92, a regression line La (map information) is created based on the block voltage values V and the average block voltage values Va previously accumulated in the fixed period (cycle 2), and the regression line La is stored in a second memory 94b.

In the three fixed periods (cycle 1 to cycle 3) from the time t1 of starting operation of the secondary battery system 10, since the regression line La (map information) is not created, operations of the reference voltage acquisition unit 82 and the voltage comparator circuit 86 are stopped. That is, these periods define an operation stop period Ts of the reference voltage acquisition unit 82 and the voltage comparator circuit 86.

In the next fixed period (cycle 4), the block voltage value V and the average block voltage value Va are inputted at each monitoring cycle, and while the block voltage value V and the average block voltage value Va are accumulated in the first memory 94a, the following processing is performed concurrently. Specifically, in the regression line creation unit 92, a regression line La (map information) is created based on the block voltage value V and the average block voltage value Va accumulated in the first memory 94a in the previous fixed period (cycle 3), and the regression line La is stored in a second memory 94b. Further, in this cycle 4, a reference block voltage value Vb corresponding to the block voltage value V is acquired based on the regression line La (map information) created in the previous fixed period (cycle 3) at each monitoring cycle. Further, the difference between the block voltage value V and the reference block voltage value Vb (differential voltage value ΔV) is compared with a predetermined voltage threshold value Vth. From the next fixed period (cycle 5), the same processes as in the case of the cycle 4 are performed.

Figure 8B:
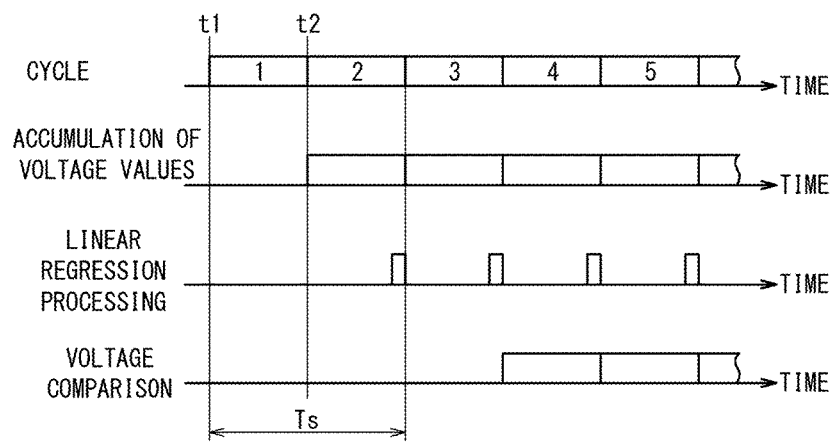
FIG. 8B is a timing chart showing a second processing sequence.

In the second processing sequence, as shown in FIG. 8B, in the fixed period (cycle 1) from the time t1 of starting operation of the secondary battery system 10, the block voltage value V and the average block voltage value Va are not inputted to the linear regression processing unit 80 due to the delay in the first delay circuit 88a and the second delay circuit 88b.

The block voltage value V and the average block voltage value Va are inputted to the linear regression processing unit 80 from the start point t2 of the next fixed period (cycle 2). The block voltage value V and the average block voltage value Va are inputted at each monitoring cycle over this fixed period (cycle 2), and accumulated in the first memory 94a. In a period corresponding to the last monitoring cycle of this cycle 2, in the regression line creation unit 92, a regression line La (map information) is created based on the block voltage value V and the average block voltage value Va accumulated in this cycle 2, and the regression line La is stored in the second memory 94b.

In this case, in the two fixed periods (cycle 1 and cycle 2) from the time t1 of starting operation of the secondary battery system 10, since the regression line La (map information) is not created, operations of the reference voltage acquisition unit 82 and the voltage comparator circuit 86 are stopped (operation stop period Ts).

In the next fixed period (cycle 3), the block voltage value V and the average block voltage value Va are inputted at each monitoring cycle, and accumulated in the first memory 94a. In a period corresponding to the last monitoring cycle, in the regression line creation unit 92, a regression line La (map information) is created based on the block voltage values V and the average block voltage values Va accumulated in this cycle 3, and the regression line La is stored in the second memory 94b. Further, in this cycle 3, at each monitoring cycle, a reference block voltage value Vb corresponding to the block voltage value V is obtained based on the regression line La (map information) created in the previous fixed period (cycle 2). Moreover, the difference between the block voltage value V and the reference block voltage value Vb (differential voltage value ΔV) is compared with a predetermined voltage threshold value Vth. From the next fixed period (cycle 4), the same processes as in the case of the cycle 3 are performed.

The above delay time in the first delay circuit 88a and the second delay circuit 88b corresponds to the fixed period. This time period can be adopted based on the behavior where the corresponding string 30 turns into an object having insulating property due to short circuiting of one battery cell 28, and the block voltage value is dropped temporarily. For example, a period selected from 10 to 60 seconds can be adopted arbitrarily (e.g., 20 seconds) as this delay time. Further, as the voltage threshold value Vth, a voltage value of a temporary drop due to short circuiting of one battery cell 28, e.g., 200 mV may be selected.

The alarm information creation unit 74 creates alarm information data 96 (see FIG. 9) based on the input of the event log signal Sel outputted from the voltage comparator circuit 86, and transmits the alarm information data 96 to the alarm information storage unit 76 and the alarm information output unit 78. For example, the following items of information are registered as the alarm information data 96.

(2a) Identification number of the module string 24 accommodating the block 26 corresponding to the voltage comparator circuit 86 as an output source of the event log signal Sel (module string information)

(2b) Identification number of the module 22 (module information)

(2c) Identification number of the block 26 (block information)

For example, as shown in FIG. 9, as one piece of alarm information data 96, from the beginning part, the present date (year, month, day), the present time (hour, minute), the module string information, the module information, the block information, and the present block voltage value V are stored.

The alarm information storage unit 76 stores the alarm information data 96 created by the alarm information creation unit 74 in a memory 98 which adopts a stack method (last-in first-out method). Therefore, the alarm information data 96 retrieved from the memory 98 is the latest alarm information data 96.

The alarm information output unit 78 converts the alarm information data 96 transmitted successively from the alarm information creation unit 74 into display data and printing data, and outputs these items of data to a monitor 100 and a printer 102, respectively, together with an error message (such as a message "SHORT-CIRCUITING ABNORMALITY"). Consequently, the alarm information (year, month, day, time, module string information, module information, block information, present block voltage value V) is displayed together with the error message on the monitor 100, and printed by the printer 102 together with the error message.

In the meanwhile, as shown in FIG. 1, the report reception unit 56 receives the report (abnormality report) indicating occurrence of an abnormality from the reporting unit 16. Specifically, when the report reception unit 56 receives the abnormality report, the report reception unit 56 starts operation of the module identification unit 58.

The module identification unit 58 identifies, among the plurality of modules 22, a module 22 corresponding to the module string information and the module information registered in the latest alarm information data 96 as a module 22 having the abnormality.

Specifically, operation of the module identification unit 58 is started by the report reception unit 56, and the module identification unit 58 identifies, as a module 22 having the abnormality, the module 22 corresponding to the module string information and the module information registered in the latest alarm information data 96 stored in the memory 98. The identified module 22 is notified to, e.g., an operator by outputting the module information and the error message (for example, "ACCIDENT IN THE FIRST MODULE") to the monitor 100 and/or the printer 102. Further, preferably, an image may be with a symbol indicating occurrence of the accident may be displayed on the monitor 100, or printed on a printing paper, together with a schematic image of the secondary battery storage unit 12, at the position of the identified module 22. In this manner, the position of the identified module 22 can be recognized at a glance.

Figure 10:
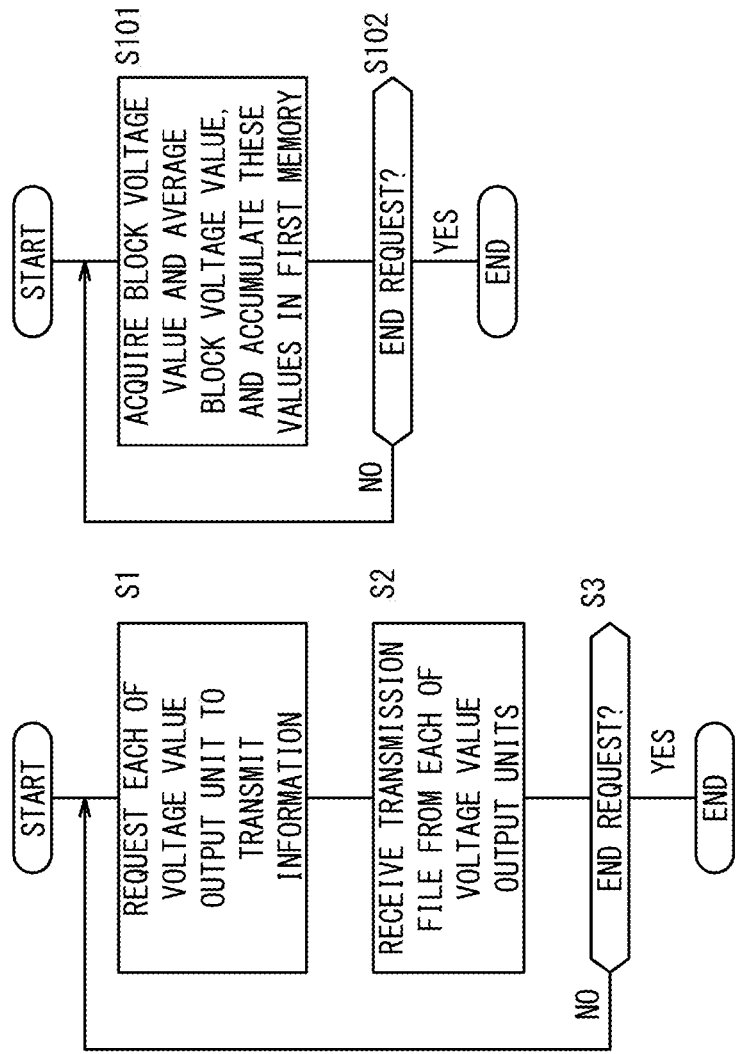
FIG. 10A is a flow chart showing an example of processing operation of an information request unit.
FIG. 10B is a flow chart showing an example of processing operation of a voltage value accumulation unit of the linear regression processing unit.
FIG. 10C is a flow chart showing an example of processing operation of a regression line creation unit of the linear regression processing unit.
Figure 11:
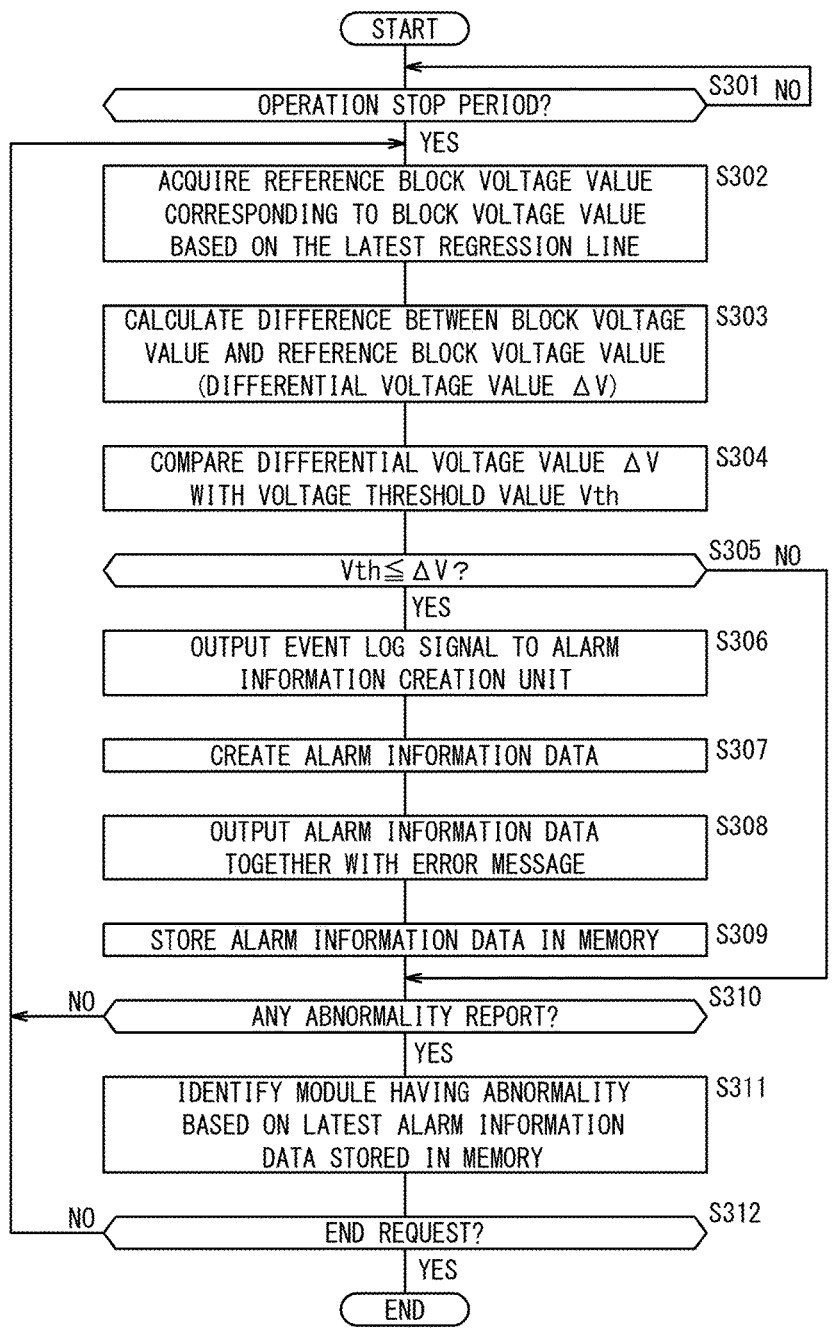
FIG. 11 is a flow chart showing an example of processing operation in a reference voltage acquisition unit, a subtracter, a voltage comparator circuit, alarm information creation unit, etc.

Next, processing operation of the abnormality identification apparatus according to the embodiment of the present invention will be described with reference to flow charts in FIGS. 10A to 11. Each of functional units of at least the information acquisition unit 54 operates under a multitask environment.

At the outset, processing operation of the information request unit 70 will be described with reference to FIG. 10A. Firstly, in step S1, the information request unit 70 requests each of the voltage value output units 60 of the information transmission unit 52 to transmit information. Upon the transmission request of information from the information request unit 70, each of the voltage value output units 60 transmits a transmission file 68 including information of the corresponding module string 24 to the information acquisition unit 54.

In step S2, the information request unit 70 receives the transmission file 68 from each of the voltage value output units 60.

In step S3, it is determined whether or not there is a request for stopping operation of the information request unit 70 (e.g., end request due to interruption of the power supply, maintenance operation, etc.). If there is no request for stopping operation, the routine returns to step S1 to repeat the processes of step S1 and the subsequent steps. If there is an end request, operation of the information request unit 70 is finished.

Next, processing operation of the voltage value accumulation unit 90 of the linear regression processing unit 80 will be described with reference to FIG. 10B. Firstly, in step S101, the block voltage value V of each of all of the blocks 26 included in the acquired transmission file 68 and the average block voltage value Va of each module are obtained, and accumulated in the first memory 94a.

In step S102, it is determined whether there is an end request to the voltage value accumulation unit 90 of the linear regression processing unit 80. If there is no request for stopping operation, the routine returns to step S101 to repeat the processes of step S101 and the subsequent steps. If there is an end request, operation of the voltage value accumulation unit 90 is finished.

Next, processing operation of the regression line creation unit 92 of the linear regression processing unit 80 will be described with reference to FIG. 10C. Firstly, in step S201, a regression line La (map information) is created based on the block voltage values V and the average block voltage values Va accumulated in the first memory 94a, and the regression line La is stored in the second memory 94b.

In step S202, it is determined whether there is an end request to the regression line creation unit 92 of the linear regression processing unit 80. If there is no request for stopping operation, the routine returns to step S201 to repeat the processes of step S201 and the subsequent steps. When an end request is made, operation of the regression line creation unit 92 is finished.

Next, operation of the reference voltage acquisition unit 82, the subtracter 84, the voltage comparator circuit 86, the alarm information creation unit 74, etc. will be described with reference to FIG. 11.

Firstly, in step S301, it is determined whether the present period is the operation stop period Ts. If the present period is the operation stop period Ts, the routine waits for the end of the operation stop period Ts. When operation of the operation stop period Ts is finished, the routine proceeds to the next step S302. The reference voltage acquisition unit 82 acquires the reference block voltage value Vb corresponding to the block voltage value V based on the latest regression line La (map information) created by the regression line creation unit 92.

In step S303, the subtracter 84 calculates the difference between the block voltage value V and the reference block voltage value Vb (differential voltage value ΔV). In step S304, the voltage comparator circuit 86 compares the difference voltage value ΔV with the voltage threshold value Vth. In step S305, if it is determined that the differential voltage value ΔV is the voltage threshold value Vth or more, the routine proceeds to step S306 to output an event log signal Sel from the voltage comparator circuit 86 to the alarm information creation unit 74.

In step S307, the alarm information creation unit 74 creates the alarm information data 96. Specifically, the alarm information creation unit 74 creates the alarm information data 96 having registrations of the following items of information, (3a) Present date and time (3b) Identification number of the module string 24 accommodating the block 26 corresponding to the voltage comparator circuit 86 as an output source of the event log signal Sel (module string information)

(3c) Identification number of the module 22 (module information)

(3d) Identification number of the block 26 (block information)

In step S308, the alarm information output unit 78 converts the created alarm information data 96 into display data and printing data, and outputs these items of data to the monitor 100 and the printer 102, respectively, together with an error message (such as a message "SHORT-CIRCUITING ABNORMALITY").

In step S309, the alarm information storage unit 76 stores the alarm information data 96 created by the alarm information creation unit 74 in the memory 98 which adopts a stack method (last-in first-out method).

In step S310, the report reception unit 56 determines whether there is any report (abnormality report) indicating occurrence of an abnormality from the reporting unit 16. If no abnormality report has been received, the routine returns to step S302 to repeat the processes of step S302 and the subsequent steps.

If any abnormality report has been received, the routine proceeds to the next step S311 to perform operation in the module identification unit 58. Specifically, the module identification unit 58 identifies, as a module 22 having the abnormality, a module 22 corresponding to the module string information and the module information registered in the latest alarm information data 96 stored in the memory 98. Then, the module identification unit 58 outputs the module information and the error message regarding the identified module 22 to the monitor 100 and/or the printer 102.

In step S312, it is determined whether or not there is a request for stopping operation of the information acquisition unit 54. If there is no request for stopping operation, the routine returns to step S302 to repeat the processes of step S302 and the subsequent steps. When a request for stopping operation is made, operations of the reference voltage acquisition unit 82, the subtracter 84, the voltage comparator circuit 86, the alarm information creation unit 74, etc. are stopped.

As described above, in the abnormality position identification apparatus 50 and the abnormality identification method according to the embodiment of the present invention, the following advantages are obtained.

Specifically, normally, if external short circuiting or internal short circuiting occurs in any one of the battery cells 28, the block voltage value V of the block 26 including the battery cell 28 having the short circuiting is decreased steeply. Thereafter, in some cases, after the elapse of 1.5 to 2 minutes, the voltage returns to the original voltage level before short circuiting. Further, if the scale of the system becomes large, the number of blocks to be monitored is increased correspondingly. Therefore, it becomes more difficult to recognize the decrease in the voltage due to short circuiting from the changes of the block voltage values V of all of the blocks 26.

Further, when the block voltage value V is decreased temporarily, e.g., by adjustment in the frequency of the electric power system, adjustment in the difference between the generated electric power from natural energy based power generators and its planned output electric power, and adjustment of power demands and power supplies in the electric power system, in some cases, this decrease in the block voltage value V may be detected erroneously as the temporary drop of the block voltage value V due to short circuiting of at least one of the battery cells 28.

However, in the embodiment of the present invention, among the plurality of module 22, information of the following module 22 is acquired. Specifically, the reference block voltage value Vb is obtained from the correlation relationship between the block voltage value V and the average block voltage value Va. In the case where the difference ΔV between the reference block voltage value Vb and the block voltage value V is the predetermined voltage threshold value Vth or more, information of the module 22 accommodating the block 26 as the output source of the block voltage value V is acquired. Then, alarm information data 96 is created based on the acquired information of the module 22. At the time of receiving the abnormality report in the report reception unit 56, a module 22 corresponding to at least the latest alarm information data 96 is identified as a module 22 having the abnormality. In this manner, by identifying the module 22 which is the source of the abnormality, it becomes possible to transmit a report to a local user, a local administrator, etc. Therefore, countermeasures focused on the identified abnormality source can be taken at an early stage. It becomes possible to suppress expansion of the damage.

Further, it is possible to accurately detect whether there is a decrease in the block voltage value V, and detect occurrence of an abnormality due to short circuiting. Further, it is possible to improve the detection accuracy of the block 26 having a temporary drop in the block voltage value V due to short circuiting of at least one of the battery cells 28. Moreover, even if the block voltage value V is decreased temporarily, e.g., by adjustment in the frequency of the electric power system, adjustment in the difference between the generated electric power from natural energy based power generators and its planned output electric power, and adjustment of power demands and power supplies in the electric power system, this decrease in the block voltage value V is not detected erroneously as the temporary drop of the block voltage value V due to short circuiting of at least one of the battery cells 28.

In particular, in the embodiment of the present invention, in the linear regression processing unit 80, the relationship between the plurality of block voltage values V and the plurality of average block voltage values Va accumulated in the fixed period is subjected to linear regression processing to acquire one regression line La (map information). Further, in the reference voltage acquisition unit 82, the reference block voltage Vb corresponding to the block voltage value V is acquired based on the information of the regression line La every unit time. In this manner, it is possible to obtain the reference block voltage value Vb easily based on the correlation relationship between the block voltage value V and the average block voltage value Va, and achieve acceleration of computation.

It is a matter of course that the apparatus, the method, and the non-transitory recording medium storing the program for identifying a position of an abnormality occurred in a secondary battery system according to the embodiment of the present invention are not limited to the embodiments described above, and various structures can be adopted without deviating the gist of the present invention.

What is claimed is:

1. An apparatus for identifying a position of an abnormality occurred in a secondary battery system, the secondary battery system comprising a plurality of modules each accommodating one or more blocks, the blocks each being forming by connecting battery cells of two or more secondary batteries, the apparatus comprising:
   a means for detecting voltage of the secondary batteries on a block by block basis and for outputting the detected voltage as a block voltage value every unit time, each unit time being in a range of 0.5 to 2 seconds;
   a means for calculating an average block voltage value of each module, based on the block voltage value provided from the means for detecting the voltage every unit time,
   a means for acquiring information of a module accommodating a block as an output source of the block voltage value, when a reference block voltage value is obtained from a correlation relationship between the block voltage value and the average block voltage value of the corresponding module, and a difference between the reference block voltage value and the block voltage value is a predetermined voltage threshold value or more,
   a means for receiving a report of an abnormality occurred in the secondary batteries; and
   a means for identifying, as a module having the abnormality, the module corresponding to the module information at a time of receiving the report by the means for receiving the report.

2. The apparatus according to claim 1,
wherein the means for acquiring information acquisition unit includes a means for comparing a voltage difference between the block voltage value and the reference block voltage value with a predetermined voltage threshold value, and
the means for comparing the voltage difference includes:
   a means for performing a linear regression processing of a relationship between a plurality of block voltage values and a plurality of average block voltage values accumulated in a fixed period to obtain information of one regression line; and
   a means for acquiring a reference block voltage value corresponding to the block voltage value every unit time, based on information of the one regression line.

3. The apparatus according to claim 2, wherein the means for processing the linear regression processing accumulates the plurality of block voltage values and the plurality of average block voltage values, and concurrently, performs linear regression processing of a relationship between the plurality of block voltage values and the plurality of average block voltage values accumulated in the fixed period in a last time to obtain information of the one regression line.

4. The apparatus according to claim 3, wherein the regression line is updated at every interval of the fixed period, and the means for acquiring the reference block voltage acquires the reference block voltage value of the fixed period in a present time, based on the information of the one regression line acquired in the fixed period in the last time.

5. The apparatus according to claim 2, wherein the means for processing the linear regression accumulates the plurality of block voltage values and the plurality of average block values in the fixed period, and in a period corresponding to the unit time at an end of the fixed period, performs linear regression processing of a relationship between the plurality of block voltage values and the plurality of average block voltage values accumulated in the fixed period to acquire the information of the one regression line.

6. The apparatus according to claim 5, wherein the regression line is updated at every interval of the fixed period, and the means for acquiring the reference block voltage value acquires the reference block voltage value in the fixed period in a present time based on information of the one regression line acquired in the period corresponding to the unit time at the end of the fixed period in a last time.

7. The apparatus according to claim 2, wherein in a period from time of starting operation of the secondary battery system to a time at which information of the one regression line is acquired for a first time, no operation is performed at least in the means for acquiring the reference block voltage value and the means for acquiring information.

8. The apparatus according to claim 2, wherein the block voltage value is inputted to the means for processing the linear regression and the means for acquiring the reference block voltage value through a delay circuit for introducing a delay by the fixed period; and
   the average block voltage value is inputted to the linear regression processing unit through a delay circuit configured to introduce a delay by the fixed period.

9. The apparatus according to claim 8, wherein the delay is selected in accordance with behavior where the block voltage value drops temporarily due to short circuiting of at least one of the battery cells.

10. The apparatus according to claim 1, wherein, as the voltage threshold value, a voltage value of a temporary drop in the block voltage value due to short circuiting of at least one of the battery cells is selected.

11. The apparatus according to claim 1, further comprising a means for receiving the module information from the information acquisition unit, and outputting the module information together with an error message.

12. A method of identifying a position of an abnormality occurred in a secondary battery system, the secondary battery system comprising a plurality of modules each accommodating one or more blocks, the blocks each being formed by connecting battery cells of two or more secondary batteries, the method comprising the steps of:
   a step of performing voltage measurement by detecting a voltage of the secondary batteries on a block by block basis, and outputting the detected voltage as a block voltage value every unit time, every unit time falling in a range of 0.5 to 2 seconds;
   a step of performing an average block voltage calculation by calculating an average block voltage value of each module, based on the block voltage value provided from the voltage measurement step every unit time;

a step of performing information acquisition by acquiring information of a module accommodating a block as an output source of the block voltage value, when a reference block voltage value is obtained from correlation relationship between the block voltage value and an average block voltage value of the corresponding module, and a difference between the reference block voltage value and the block voltage value is a predetermined voltage threshold value or more;

a step of performing report reception by receiving a report of an abnormality occurred in the secondary batteries; and a step of performing module identification by identifying, as a module having the abnormality, the module corresponding to at least latest module information at time of receiving the report.

13. A non-transitory recording medium storing a program for a secondary battery system including a plurality of modules each accommodating one or more blocks, the blocks each being formed by connecting battery cells of two or more secondary batteries, a means for detecting voltage of the secondary batteries on a block by block basis, and for outputting the detected voltage as a block voltage value every unit time, and an average block voltage calculation a means for calculating an average block voltage value of each module, based on the block voltage value provided from the means for detecting voltage every unit time, the every unit time falling in a range of 0.5 to 2 seconds, the program being configured to allow the secondary battery system to perform functions of:

a step of acquiring information of a module accommodating a block as an output source of the block voltage value, when a reference block voltage value is obtained from correlation relationship between the block voltage value and an average block voltage value of the corresponding module, and a difference between the reference block voltage value and the block voltage value is a predetermined voltage threshold value or more;

a step of receiving a report of an abnormality occurred in the secondary batteries; and a step of identifying, as a module having the abnormality, the module corresponding to at least latest module information at time of receiving the report by the report reception function.

* * * * *

UNITED STATES PATENT AND TRADEMARK OFFICE
CERTIFICATE OF CORRECTION

PATENT NO. : 10,203,377 B2
APPLICATION NO. : 15/053257
DATED : February 12, 2019
INVENTOR(S) : Motohiro Fukuhara It is certified that error appears in the above-identified patent and that said Letters Patent is hereby corrected as shown below:

On the Title Page

Assignee, Item (73)
Please change: "Assignee: NGK Insultors, Ltd., Nagoya (JP)" to -- Assignee: NGK Insulators, Ltd., Nagoya (JP) --

Signed and Sealed this
Ninth Day of April, 2019

Andrei Iancu
*Director of the United States Patent and Trademark Office*